(12) United States Patent
Husung et al.

(10) Patent No.: US 10,536,784 B2
(45) Date of Patent: Jan. 14, 2020

(54) HEARING DEVICE WITH AN EARPIECE AND METHOD FOR CONTROLLING A HEARING DEVICE

(71) Applicant: SIVANTOS PTE. LTD., Singapore (SG)

(72) Inventors: Kunibert Husung, Erlangen (DE); Frank Naumann, Bubenreuth (DE)

(73) Assignee: Sivantos Pte. Ltd., Singapore (SG)

( * ) Notice: Subject to any disclaimer, the term of this patent is extended or adjusted under 35 U.S.C. 154(b) by 0 days.

(21) Appl. No.: 15/911,648

(22) Filed: Mar. 5, 2018

(65) Prior Publication Data
US 2018/0199140 A1 Jul. 12, 2018

Related U.S. Application Data

(63) Continuation of application No. PCT/EP2016/073499, filed on Sep. 30, 2016.

(30) Foreign Application Priority Data

Oct. 6, 2015 (DE) .......................... 10 2015 219 310

(51) Int. Cl.
*H04R 25/00* (2006.01)
*H04R 1/10* (2006.01)

(52) U.S. Cl.
CPC ........... *H04R 25/40* (2013.01); *H04R 1/1041* (2013.01); *H04R 25/604* (2013.01); *H04R 25/65* (2013.01); *H04R 2225/43* (2013.01)

(58) Field of Classification Search
CPC ...... H04R 25/40; H04R 25/604; H04R 25/65; H04R 25/652; H04R 1/1041; H04R 1/1016; H04R 2225/43; H04R 2225/61; H04R 2460/03; H03K 17/941; H03K 17/955
See application file for complete search history.

(56) References Cited

U.S. PATENT DOCUMENTS

| | | | |
|---|---|---|---|
| 4,332,468 A * | 6/1982 | Stutzle | G01S 17/10 102/213 |
| 4,955,729 A | 9/1990 | Marx | |
| 6,532,294 B1 | 3/2003 | Rudell | |
| 2005/0238190 A1* | 10/2005 | Rohrlein | H03G 3/04 381/312 |
| 2011/0091058 A1 | 4/2011 | Sacha et al. | |

(Continued)

FOREIGN PATENT DOCUMENTS

| | | |
|---|---|---|
| DE | 3840393 A1 | 6/1989 |
| DE | 102008054087 A1 | 12/2009 |

*Primary Examiner* — Tuan D Nguyen
(74) *Attorney, Agent, or Firm* — Laurence A. Greenberg; Werner H. Stemer; Ralph E. Locher

(57) ABSTRACT

A hearing device, in particular a hearing aid device, includes an earpiece with a first proximity sensor, a second proximity sensor and a control unit. The first proximity sensor is configured to transfer a first proximity signal to the control unit and the second proximity sensor is configured to transfer a second proximity signal to the control unit. The earpiece can be inserted into the external auditory canal of a user of the hearing device for operating the hearing device. The control unit is configured to control an operating mode of the hearing device according to changes in the first proximity signal and the second proximity signal. A method for controlling a hearing device is also provided.

9 Claims, 2 Drawing Sheets

(56) References Cited

U.S. PATENT DOCUMENTS

| | | | |
|---|---|---|---|
| 2014/0213323 A1* | 7/2014 | Holenarsipur | H03K 17/955 455/566 |
| 2017/0064830 A1* | 3/2017 | Jiang | H05K 1/147 |
| 2017/0078785 A1* | 3/2017 | Qian | H04R 1/1041 |
| 2017/0094389 A1* | 3/2017 | Saulsbury | H04R 1/1016 |

* cited by examiner

HEARING DEVICE WITH AN EARPIECE AND METHOD FOR CONTROLLING A HEARING DEVICE

CROSS-REFERENCE TO RELATED APPLICATION

This application is a continuation, under 35 U.S.C. § 120, of copending International Application PCT/EP2016/073499, filed Sep. 30, 2016, which designated the United States; this application also claims the priority, under 35 U.S.C. § 119, of German Patent Application DE 10 2015 219 310.1, filed Oct. 6, 2015; the prior applications are herewith incorporated by reference in their entirety.

BACKGROUND OF THE INVENTION

Field of the Invention

The invention relates to a hearing device, in particular to a hearing aid device, with an earpiece and a control unit, in which the earpiece can be inserted at least partly into the external auditory canal of a user of the hearing device for the operation of the hearing device and the control unit is configured to control an operating mode of the hearing device. The invention also relates to a method for controlling a hearing device.

Due to the small dimensions in a hearing device, the power supply fundamentally presents one of the main challenges. A hearing device usually includes at least one acousto-electric transducer, which may be embodied as a microphone for instance, a signal processing unit, and at least one electro-acoustic transducer, which may be embodied as a loudspeaker, for example.

During operation of the hearing device, the acousto-electric transducer then converts sound from the surroundings into an electrical input signal, which the signal processing unit amplifies, inter alia, and processes further, possibly by filter processes or the like, into an output signal, from which the electro-acoustic converter generates a sound signal, which is fed to a hearing system of a user of the hearing device. In this context, the signal processing usually includes an analog-to-digital converter for digitizing the input signal, and a digital-to-analog converter for the output signal. Depending on the construction of the hearing device, additional components can also be provided, for instance components such as an electromagnetic signal receiver for receiving audio signals (a so-called "telecoil") or, for binaural hearing device systems, also a transmission unit for communication between each of the hearing devices.

During operation of the hearing device, those components each add to the consumption of the power provided in the hearing device by a power source, which usually includes a non-rechargeable or rechargeable battery. Even if a user of the hearing device selects a low gain in the signal processing, considerable consumption compared with the total amount of power available can result during a continuously maintained operating mode. Against the background of the requirements regarding dimensioning of the power source and the resultant restrictions on the energy available in the hearing device, the consumption should therefore be reduced to the lowest possible level.

To this end, a standby operating mode is usually provided, in which the functions that are active in the hearing device are reduced to a minimum. Thus, for instance, the generation of the input signal and the signal processing and hence also the conversion of the output signal into sound can be deactivated, and only a minimum operation maintained, which is necessary for the reactivation of those functions for the normal operating mode. The changeover between the standby mode and the normal operating mode, however, presents not only the problem that, due to the dimensions of the hearing device, a suitable switching device is actually undesirable on the hearing device because the tight space available is usually earmarked for a switching device for operating the standard hearing device functions such as e.g. controlling the volume level or selecting the operating program, but also the problem that the changeover should be configured in such a way that it can be controlled as much as possible according to the wishes of the user.

German Patent Application DE 10 2008 054 087 A1 discloses a hearing device having a capacitive proximity sensor, wherein the proximity sensor is used to detect whether the hearing device is being worn in the ear, and is switched on or off accordingly. The proximity sensor can also be disposed and configured in such a way that it is equipped to detect hand movements of the user, through the use of which it is possible to activate operating functions of the hearing device. Two proximity sensors can also be used for that purpose.

U.S. Patent Application 2011/0091058 A1 describes a hearing device having two capacitive sensors, wherein a first sensor on the outside battery door responds to finger movements, and a second sensor is disposed inside the ear. The second sensor is intended in that case to detect a body contact and hence a "being worn" state in order to switch the hearing device on or off on the basis of the detection. The set of functions that can be operated by the first sensor by using finger movements can depend in that case on the "being worn" state detected using the second sensor.

SUMMARY OF THE INVENTION

It is accordingly an object of the invention to provide a hearing device with an earpiece and a method for controlling a hearing device, which overcome the hereinafore-mentioned disadvantages of the heretofore-known devices and methods of this general type, which assume an operating mode required by the user of the hearing device as simply as possible and which are also intended to facilitate a minimum possible power consumption.

With the foregoing and other objects in view there is provided, in accordance with the invention, a hearing device, in particular a hearing aid device, comprising an earpiece having a first proximity sensor and a second proximity sensor, and including a control unit, wherein the first proximity sensor is configured to transmit a first proximity signal to the control unit, the second proximity sensor is configured to transmit a second proximity signal to the control unit, the earpiece can be inserted at least in part into the external auditory canal of a user of the hearing device for the operation of the hearing device, and the control unit is configured to control an operating mode of the hearing device on the basis of changes in the first proximity signal and in the second proximity signal. Specifically, the control unit is configured to shift the hearing device into an active operating mode in the event of a change in the first proximity signal and a change in the second proximity signal, which change in the second proximity signal follows at a predetermined time interval after the change in the first proximity signal, and/or to shift the hearing device into an inactive operating mode in the event of a change in the second proximity signal and a change in the first proximity signal, which change in the first proximity signal follows at a predetermined time interval after the change in the second proximity signal. The first proximity sensor and the second proximity sensor are disposed in the earpiece one behind the other with respect to an insertion direction of the hearing device into the external auditory canal.

The subject matter of the dependent claims and of the description below contains advantageous embodiments, some of which are inventive in their own right.

In the case of a BTE ("behind-the-ear") hearing device, the earpiece is preferably embodied as an ear mold, which is connected to the housing of the hearing device through a sound tube. In the case of an RIC ("receiver-in-canal") hearing device, the earpiece preferably includes the loudspeaker of the hearing device. In both cases mentioned, the first proximity sensor and the second proximity sensor are preferably connected to the control unit by suitable signal connections, which are taken through the sound tube (BTE) or through a signal channel (RIC), which also includes the receiver connection. In the case of an ITE ("in-the-ear") hearing device, the earpiece can be embodied as part of the housing of the hearing device. In particular, the earpiece is inserted into the external auditory canal of the user of the hearing aid when the hearing aid is being operated as intended.

The first proximity sensor and the second proximity sensor are each configured in particular as a contactless proximity sensor or as a tactile sensor. A change in the first proximity signal and/or in the second proximity signal includes in particular in this case a change in the signal level detected in the control unit. If one of the proximity signals is embodied as a voltage signal, for example, then a change in this proximity signal is in particular given by a change in the signal voltage. Equally, however, a pulsed operation of the proximity sensors is also included, in which at designated retrieval times, the particular proximity sensor automatically transmits to the control unit at each retrieval time a signal pulse from its proximity signal, or at designated retrieval times, the control unit requests the particular proximity sensor to send the signal pulse. In particular, such a request is itself implemented by a retrieval pulse being sent to the particular proximity sensor at the defined retrieval time instant, for instance by the control unit applying a signal voltage briefly and thus in a pulsed manner to the proximity sensor. The first proximity sensor and the second proximity sensor are preferably configured in this case to be affected by a human body, i.e. it can be determined at least approximately from the proximity signal concerned whether at a given point in time a part of a human body is located within range of the proximity sensor concerned.

The configuration of the first proximity sensor and of the second proximity sensor one behind the other with respect to an insertion direction shall be understood to mean in particular that a predominant direction is defined on the earpiece by the direction of movement of the earpiece during insertion into the external auditory canal, which predominant direction provides a reference for the configuration of the proximity sensors. In this context, placing one behind the other means that during insertion one of the two proximity sensors experiences a change in its proximity signal that, within the bounds of the time resolution capabilities, is noticeably earlier than the other proximity sensor. For this purpose, the two proximity sensors lie in particular directly adjacent one another in the insertion direction, or even opposite in the earpiece but at a certain offset with respect to the insertion direction. The latter embodiment is particularly advantageous because the spatial separation of the two proximity sensors can prevent more effectively an unwanted change in the proximity signals earlier when the earpiece is picked up.

A predetermined time interval for the changes in the two proximity signals includes in this case in particular a time interval from a predetermined range. The predetermined time interval or the range shall be selected in this case in such a way that an insertion movement of the earpiece into the external auditory canal of the user and/or a removal of the earpiece from the external auditory canal can be identified for sequences of movement deemed to be typical. In this case, the corresponding speeds of movement shall preferably be estimated or measured by way of example. Preferably, in the active operating mode, the hearing device is configured for operation with all the main functions, whereas in the inactive operating mode, all the main functions of the hearing aid, possibly with the exception of energy management and control of the operating modes themselves, are inactive.

A change in the first proximity signal of the first proximity sensor and/or in the second proximity signal of the second proximity sensor occurs in particular when the earpiece is inserted into the external auditory canal of the user of the hearing device for the purpose of intended operation. Specifically, it can be assumed that prior to the operation, the hearing device is kept in a manner in which the two proximity sensors do not detect any notable proximity to a part of the human body, for instance it is kept on an open base or in a case that shields the proximity sensors. Upon insertion into the external auditory canal, the first proximity sensor and the second proximity sensor then detect the immediate proximity to a part of the human body, in this case to the skin in the external auditory canal. This change produces changes in the first proximity signal and in the second proximity signal, from which changes the control unit can infer a corresponding insertion into the external auditory canal. This allows the control unit to infer that the user now wants the intended operation of the hearing device, because the user has positioned the hearing device accordingly. Likewise, upon removal of the earpiece from the external auditory canal in order to conclude the intended operation, a change usually takes place in the two proximity signals, because the two proximity sensors now no longer detect the proximity to the skin in the external auditory canal. The control unit can hence infer that now the intended operation is no longer required, and can actuate an inactive operating mode of the hearing device in order to conserve the power source.

In this context, determining the positioning from two proximity sensors has the advantage that the proximity sensors can be disposed for this purpose in the earpiece in such a way, e.g. behind one another in the insertion direction or opposite, that actions in which only one proximity sensor produces a change in its proximity signal, for instance picking up for carrying or accidental contacts, are identified as actions for which another operating mode is not meant to be actuated.

Thus, the invention makes it possible to identify in a particularly simple manner which operating mode is wanted by the user of the hearing device, and consequently to actuate an inactive operating mode for low power consumption without the need for separate costly operator controls to achieve this.

The control unit is advantageously configured to control the operating mode of the hearing device according to a time sequence of changes in the first proximity signal and in the second proximity signal. If the earpiece is inserted into the external auditory canal for the intended operation of the hearing device, or is removed from the external auditory canal in order to conclude the operation, then given suitable positioning of the first proximity sensor and of the second proximity sensor and as a result of the movement of the earpiece relative to the external auditory canal, the corresponding changes in the first proximity signal and in the second proximity signal are delayed with respect to one another. It is then possible for the control unit to identify from the sequence of the changes in the respective first and second proximity signal a movement and a direction of movement of the earpiece relative to the external auditory canal. It can be inferred therefrom whether the user currently wishes to start or conclude the intended operation, and the operating mode of the hearing device can be controlled accordingly.

In an advantageous embodiment of the invention, the first proximity signal is transmitted to the control unit by the first proximity sensor in pulsed operation at a defined first pulse repetition frequency and/or the second proximity signal is transmitted to the control unit by the second proximity sensor in pulsed operation at a defined second pulse repetition frequency. This means in particular that rather than transmitting the first proximity signal and/or the second proximity signal continuously to the control unit, repeated status retrievals are made by respective signal pulses at time intervals defined by the associated pulse repetition frequency. In particular in this case, the first pulse repetition frequency is identical to the second pulse repetition frequency. By virtue of pulsed operation, it is not necessary to continuously supply the proximity sensors with power, thereby allowing a further reduction in the consumption.

Advantageously in this case, the defined first pulse repetition frequency and/or the defined second pulse repetition frequency is reduced after a specified time period in an active and/or inactive operating mode of the hearing device. In particular this case includes the situation in which the repetition of the individual signal pulses of the first proximity signal and/or of the second proximity signal gradually increases the time intervals between each signal pulse the longer the same operating mode prevails. This is based on the consideration that once the earpiece has been inserted into the external auditory canal at the start of the operation of the hearing device, the operation is usually maintained for a very long time in the timescale of the pulse repetition frequency. Whereas in this case adjustment movements by the earpiece may still be made initially, which can result in repeated changes in the proximity signals, the likelihood of renewed removal falls with increasing length of operation; the operation is then maintained for a long period in that timescale. Conversely, apart from the adjustment movements at the start of operation, once the earpiece has been removed in order to conclude the operation, the hearing device is usually not put back into operation immediately but typically remains out of operation for a long period in the timescale. This circumstance is advantageously taken into account by reducing the corresponding pulse repetition frequency for pulsed operation of the particular proximity sensor, because it is thereby possible to reduce further the power consumption caused by the operation of the proximity sensors themselves.

In a further advantageous embodiment of the invention, the first proximity sensor and/or the second proximity sensor are each configured as a contactless proximity sensor. In particular this includes an embodiment in each case as a capacitive sensor or as an optical sensor. The embodiment as contactless proximity sensors has the advantage for the user that the quality of the respective proximity signals does not depend on the strength of contact with the skin in the external auditory canal, which otherwise might feel unpleasant. In addition, specifically in the present case in which contact is made in the external auditory canal, they are less prone to errors arising from the complex geometry of the auditory canal and from the potential moistness of the skin there.

The first proximity sensor and/or the second proximity sensor are each advantageously configured as a capacitive sensor for this purpose. Choosing as the first proximity sensor and/or second proximity sensor, capacitive proximity sensors, which even with an extremely compact construction generate proximity signals that are sufficiently meaningful for the present application, is particularly advantageous in light of the limited installation space in the earpiece.

The first proximity sensor and/or the second proximity sensor are preferably each formed by a planar electrode pair, wherein the two electrodes of the electrode pair of the particular proximity sensor are disposed opposite one another at a distance that is small relative to their dimensions. Preferably in this case, the space between the two electrodes of a proximity sensor is filled with a dielectric. The embodiment described makes use of the fact that in a capacitive component the electrical capacitance in the standard structures decreases with increasing distance between the two electrodes of the capacitive element, and a greater spatial overlap is beneficial to the electrical capacitance. Since in a capacitive proximity sensor, changes in the proximity signal, given a constant reference stimulus, are substantially linearly dependent on the electrical capacitance, a highest possible electrical capacitance is desirable. The construction mentioned above allows a capacitive proximity sensor with a relatively high electrical capacitance to be implemented in a compact configuration.

With the objects of the invention in view, there is also provided a method for controlling a hearing device, in particular a hearing aid device, which comprises an earpiece having a first proximity sensor and a second proximity sensor, the first proximity sensor and the second proximity sensor being disposed in the earpiece one behind the other with respect to an insertion direction of the hearing device into the external auditory canal, the first proximity sensor generating a first proximity signal, the second proximity sensor generating a second proximity signal, the earpiece being inserted at least in part into the external auditory canal of a user of the hearing device for the operation of the hearing device, and the hearing device being shifted into an active operating mode in the event of a change in the first proximity signal and a change in the second proximity signal, which change in the second proximity signal follows at a predetermined time interval after the change in the first proximity signal, and/or the hearing device being shifted into an inactive operating mode in the event of a change in the second proximity signal and a change in the first proximity signal, which change in the first proximity signal follows at a predetermined time interval after the change in the second proximity signal. The advantages mentioned for the hearing device and its developments can be applied analogously to the method.

Advantageously in this case, a change in the first proximity signal and a change in the second proximity signal, which change in the second proximity signal follows at a predetermined time interval after the change in the first proximity signal, are detected, and as a result the hearing device is shifted into an active operating mode, and/or a change in the second proximity signal and a change in the first proximity signal, which change in the first proximity signal follows at a predetermined time interval after the change in the second proximity signal, are detected, and as a result the hearing device is shifted into an inactive operating mode.

A predetermined time interval in this case includes in particular a time interval from a predetermined range. The predetermined time interval or the range shall be selected in this case in such a way that an insertion movement of the earpiece into the external auditory canal of the user and/or a removal of the earpiece from the external auditory canal can be identified for sequences of movement deemed to be typical. In this case, the corresponding speeds of movement shall preferably be estimated or measured by way of example. Preferably, in the active operating mode, the hearing device is configured for operation with all the main functions, whereas in the inactive operating mode, all the main functions of the hearing aid, possibly with the exception of energy management and control of the operating modes themselves, are inactive.

Actuating the active or inactive operating mode on the basis of the time sequence of the changes in the first proximity signal and in the second proximity signal makes use of the fact that in this context, introducing the earpiece into the external auditory canal and/or removing the earpiece from the external auditory canal can be identified with less risk of error, as a result of which it is possible to relatively reliably infer a required start and/or conclusion of the operation, and the operating mode of the hearing device can be controlled accordingly.

Other features which are considered as characteristic for the invention are set forth in the appended claims.

Although the invention is illustrated and described herein as embodied in a hearing device with an earpiece and a method for controlling a hearing device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
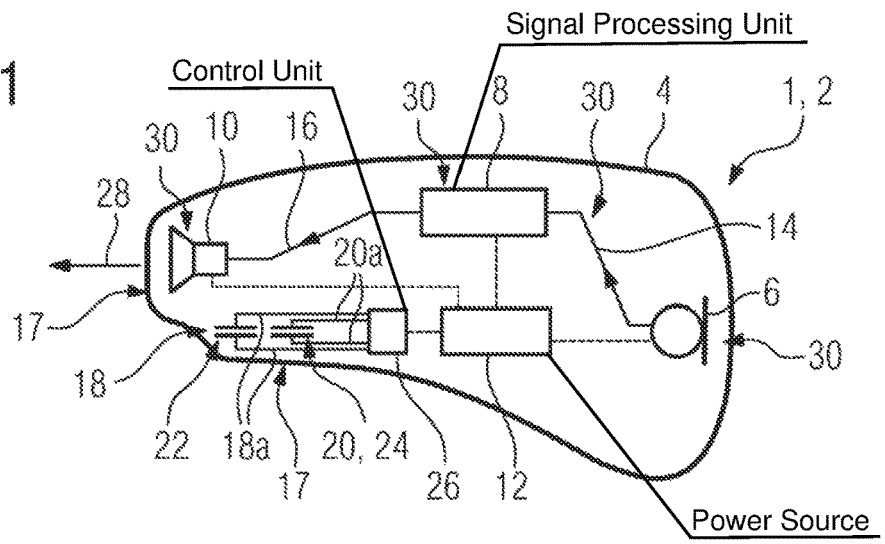
FIG. 1 is a diagrammatic, cross-sectional view of an ITE hearing device including an earpiece that has two proximity sensors.

Referring now in detail to the figures of the drawings, in which corresponding parts and variables are denoted by the same reference signs, and first, particularly, to FIG. 1 thereof, there is seen a diagrammatic, cross-sectional view of a hearing device 1, which in the present case is embodied as a hearing aid device 2 with an in "ITE" construction. The hearing device 1 includes a housing 4, inside of which a microphone 6, a signal processing unit 8, a loudspeaker 10 and a power source 12 are disposed. The microphone 6 is configured to generate an input signal 14 from a sound signal from the environment. The input signal 14 is transferred to the signal processing unit 8 which, inter alia, amplifies this signal and outputs the same as an output signal 16 for reproduction at the loudspeaker 10. The signal processing unit 8, the loudspeaker 10 and, if applicable, the microphone 6 as well, are supplied with power by the power source 12, which preferably includes a non-rechargeable or rechargeable battery for this purpose.

The housing 4 includes an earpiece 17 as well as a first proximity sensor 18 and a second proximity sensor 20. The first proximity sensor 18 and the second proximity sensor 20 are each formed by a capacitive sensor respectively including a planar electrode pair 22, 24. The two electrodes 22 of the first proximity sensor 18, and the two electrodes 24 of the second proximity sensor 20, are each connected to a control unit 26. In the present case, for example, there can be a permanent signal connection, i.e. the capacitance present at the particular proximity sensor 18, 20 can be transmitted continuously as a corresponding proximity signal 18a, 20a to the control unit 26. Pulsed operation of the two proximity sensors 18, 20 is also equally possible, however, so that the instantaneous capacitance is transmitted at a sufficiently high pulse repetition frequency, preferably in the region of several hundred to several thousand Hertz. The capacitive proximity sensors 18, 20 are configured in this case in such a way that, upon human skin making contact with the housing in the immediate vicinity of the particular proximity sensor 18, 20, it is possible to detect a distinct change in the proximity signal 18a, 20a associated with that sensor, which signal is transmitted to the control unit 26.

The hearing device 1 is meant to be inserted for the intended operation by the earpiece 17 into an external auditory canal (not shown in greater detail) of a user of the hearing device 1. Based on the configuration of the microphone 6 and of the loudspeaker 10 in the housing 4 and based on the shape of the housing 4, an insertion direction 28 can be defined as the movement direction that the hearing device 1 performs upon insertion into the external auditory canal under anatomically defined spatial restrictions. The first proximity sensor 18 and the second proximity sensor 20 are disposed in the housing 4 one behind the other with respect to the insertion direction 28.

It is now assumed that the hearing device 1 is initially not in operation, and hence is accordingly being stored by the user. The components forming a signal path 30, i.e. the microphone 6, the signal processing unit 8 and the loudspeaker 10, are not supplied with power at this time by the power source 12 in order to save energy. In the inactive state, only the control unit 26 for controlling operating modes is supplied by the power source 12 in order to facilitate a shift into an active operating mode, in which the components of the signal path 30 are also supplied.

Upon insertion of the hearing device into the external auditory canal, this shift is then achieved by the housing 4 in the region of the first proximity sensor 18 first touching the skin on the external auditory canal, resulting in a change in the first proximity signal 18a emitted from the first proximity sensor 18. Due to the fact that the second proximity sensor 20 is disposed behind the first proximity sensor 18 with respect to the insertion direction 28, upon insertion into the external auditory canal, the housing 4 is not touched by the skin until later, as a result of which the corresponding change, caused by the touch, in the second proximity signal 20a of the second proximity sensor 20 also does not happen until later than the change in the first proximity signal 18a from the first proximity sensor 18. The control unit 26 can now infer insertion of the hearing device 1 into the external auditory canal from this time sequence of the changes in the first proximity signal 18a and in the second proximity signal 20a, and in accordance with the assumption that this is done to put the active operating mode into action, can shift the hearing device into the active operating mode in which the components of the signal path 30 are also supplied with power by the power source.

Conversely, removal of the hearing device 1 from the external auditory canal can be identified from the time sequence of the changes in the first proximity signal 18a and in the second proximity signal 20a. This happens as a result of the anatomical circumstances in the reverse insertion direction, as a result of which the skin in the auditory canal ceases to make contact with the housing 4 first in the region of the second proximity sensor 20, producing a change in the corresponding second proximity signal 20a. Only thereafter is the region of the first proximity sensor 18 also completely removed from the auditory canal, which is why the change in the corresponding first proximity signal 18a occurs at a detectable time delay with respect to the change in the second proximity signal 20a. The control unit 26 identifies the removal from the external auditory canal from this sequence of the changes over time in the two proximity signals 20a, 18a, and infers a wish to conclude the intended operation of the hearing device. The hearing device 1 is accordingly shifted into the inactive operating mode in order to save energy.

Figure 2:
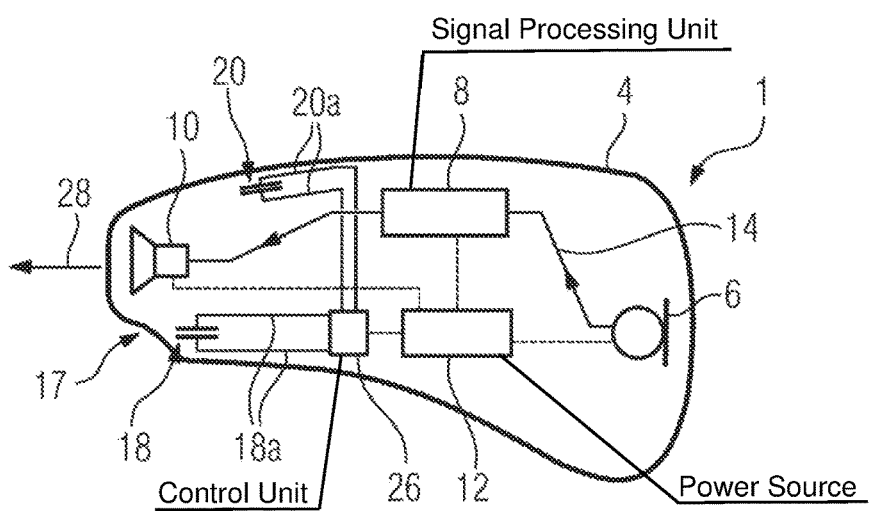
FIG. 2 is a cross-sectional view of an alternative configuration of the two proximity sensors in the earpiece of the hearing device shown in FIG. 1.

FIG. 2 is a diagrammatic, cross-sectional view of an alternative configuration of the two proximity sensors 18, 20 in the hearing device shown in FIG. 1. In this case, the first proximity sensor 18 and the second proximity sensor 20 are disposed opposite in the housing 4 but are offset with respect to the insertion direction 28 in such a way that in this embodiment upon insertion into the external auditory canal and/or removal from the external auditory canal of the user, the changes produced thereby in the proximity signals 18a, 20a from the proximity sensors 18, 20 also occur at a time offset, on the basis of which the control unit 26 can identify the direction of movement of the hearing device 1 relative to the auditory canal and hence the desired operating mode.

Figure 3:
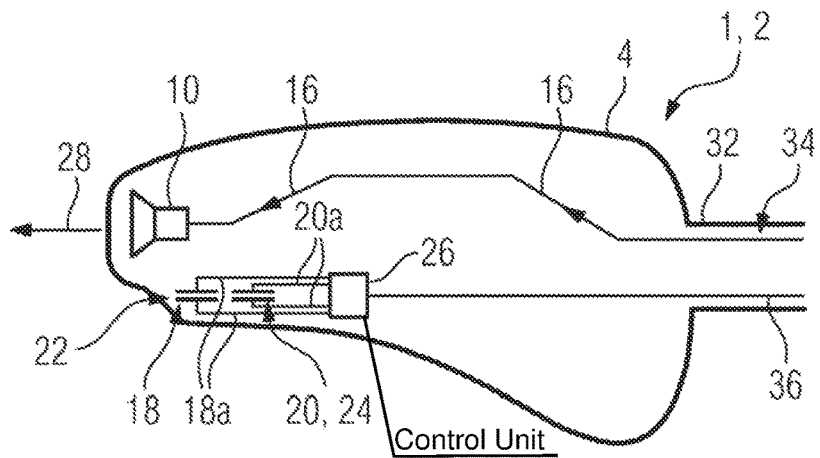
FIG. 3 is a cross-sectional view of an earpiece including two proximity sensors for an RIC hearing device.

FIG. 3 diagrammatically shows an earpiece 17 of a hearing aid device (not shown in greater detail), in which the hearing aid device is embodied in this case with an "RIC" ("receiver in canal") construction. The earpiece 17, which is meant to be inserted into the external auditory canal by the user of the hearing aid device for the operation of the hearing aid device, accordingly includes a loudspeaker 10, which receives an output signal 16 for reproduction from the signal processing unit of the hearing aid device over a signal line 34 running through a connecting piece 32. The earpiece 17 also includes two proximity sensors 18, 20, each of which is formed by a respective planar electrode pair 22 and 24, and is configured to transmit a respective proximity signal 18a and 20a to a control unit 26.

If now for the start of the intended operation, the earpiece 17 is inserted in the insertion direction 28 into the external auditory canal, then the control unit 26 detects first a change in the proximity signal 18a and subsequently a change in the proximity signal 20a. The control unit emits a corresponding signal over a control channel 36, running through the connecting piece 32, to the hearing aid device, which is thereby shifted into the active operating mode. In this case, the control channel 36 in particular also includes the power supply for the control unit 26 and, through this unit, for the proximity sensors 18, 20. The selection of the inactive operating mode of the hearing aid device by the control unit 26 upon removal of the earpiece 17 from the external auditory canal proceeds analogously.

Figure 4:
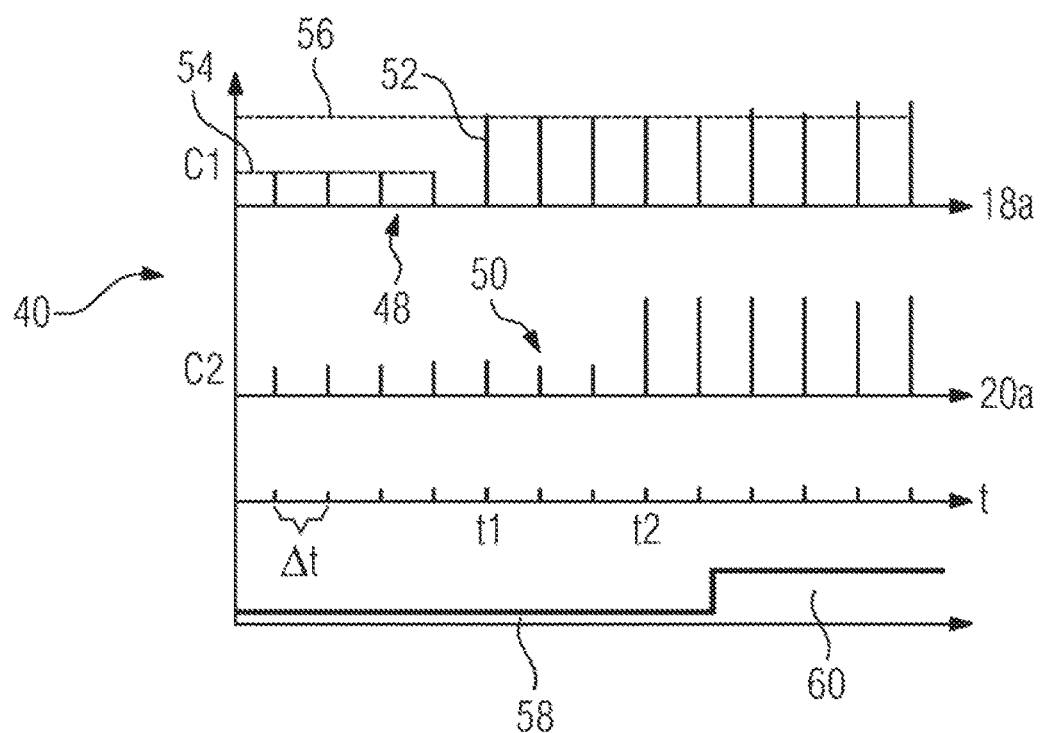
FIG. 4 is a graph using a plot against time of the proximity signals from the two proximity sensors to graphically show a method for controlling a hearing device embodied as shown in FIG. 1 to FIG. 3.

FIG. 4 shows the sequence of a method 40 that is intended to be used to control a hearing device 1 embodied as shown in FIG. 1 or FIG. 2 or FIG. 3. In this figure, the first proximity signal 18a and the second proximity signal 20a are plotted along a time axis t as the value of a corresponding capacitance C1 and C2 at the respective proximity sensor 18 and 20. The two proximity sensors 18, 20 transmit respective individual pulses 48, 50 of the first proximity signal 18a and of the second proximity signal 20a to the control unit 26 at fixed time intervals $\Delta t$, given by the inverse pulse repetition frequency. These values can be subject to a certain range of variation in this case. In the present case, first the first proximity signal experiences a change at a time t1, with the capacitance C1 of the first proximity sensor 18 assuming a distinctly larger value from a corresponding pulse 52 onwards. At a delay of several pulses, the capacitance C2 of the second proximity sensor 20 also assumes from a time t2>t1, values that are greater than before t2.

It can be inferred from this time sequence of the increase in the capacitance values in the proximity signals 18a, 20a, that the housing has first come into contact with the skin of the user of the hearing device in the region of the first proximity sensor 18—at the time t1—and then the housing has also come into contact with the skin by the region of the second proximity sensor 20. It can be inferred that insertion of the hearing device into the external auditory canal of the user must be occurring from the fact that in this process the first proximity signal 18a also does not drop again to its average value 54 after t2 but remains approximately at a raised value 56 that it adopts from the pulse 52 onwards at t1. The hearing device 1 is accordingly shifted from an inactive operating mode 58 into an active operating mode 60. It is provided in particular that between the change in the first proximity signal 18a and the change in the second proximity signal 20a, a certain time span, for instance from a range defined by a minimum number and a maximum number of pulses, must pass in order to initiate actuation of a different operating mode.

The actuation of the inactive operating mode 58 upon removal of the hearing device from the external auditory canal proceeds analogously. If applicable, the pulse repetition frequency $1/\Delta t$ can be increased gradually with increasing length of time spent in the same operating mode (in this case in the active operating mode 60).

Figure 5:
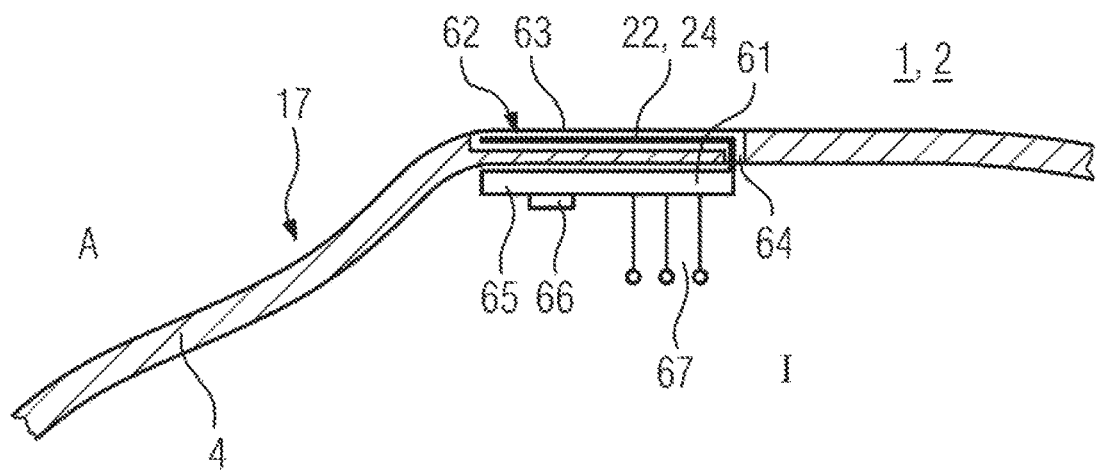
FIG. 5 is an enlarged, fragmentary, cross-sectional view of an earpiece on which proximity-sensor electronics are disposed.

FIG. 5 is a sectional view showing a portion of an earpiece 17 of a hearing device 1 or hearing aid device 2, on which proximity-sensor electronics 61 including a first and a second electrode pair 22, 24 are disposed. Each of the two electrode pairs 22, 24 hence forms a respective capacitive proximity sensor 18 and 20. In the illustrated sectional view, only one of the two electrode pairs 22, 24 is visible. The earpiece 17, for example, is part of a hearing aid device 2 with an RIC construction or with an ITE construction.

The electrode pairs 22, 24 of the proximity-sensor electronics 61 are disposed in a recess 62 on the outside A of the housing 4 of the earpiece 17. In order to provide protection from external influences, the electrode pairs 22, 24 are also provided with a seal 63. In a possible embodiment variant, the seal 63 is made by a coating applied to the outside A. Each of the electrode pairs 22, 24 is formed, for example, by two interleaved comb-shaped electrodes.

The electrode pairs 22, 24 make contact through a gap 64 in the housing 4 with a printed circuit board 65 of the proximity-sensor electronics 61. The circuit board 65 is disposed on the inside I of the housing 4 of the earpiece 17. In order to control, acquire, analyze and provide measurement data, an integrated circuit 66, for instance in the form of a microchip, or a microcontroller, is also disposed on the printed circuit board 65. Data is transferred between the proximity-sensor electronics 61 and a control unit (e.g. 26; not shown herein) of the hearing device 1 or hearing aid device 2 through leads 67. Selection of appropriate active and inactive operating modes of the hearing device 1 or hearing aid device 2 is made by the control unit on the basis of the signals from the proximity-sensor electronics 61.

Although the invention has been illustrated and described in detail using the preferred exemplary embodiment, the invention is not limited by the disclosed examples, and a person skilled in the art can derive other variations therefrom without departing from the scope of protection of the invention.

The following is a summary list of reference numerals and the corresponding structure used in the above description of the invention:
1 hearing device
2 hearing aid device
4 housing
6 microphone
8 signal processing unit
10 loudspeaker
12 power source
14 input signal
16 output signal
17 earpiece
18 first proximity sensor
18a first proximity signal
20 second proximity sensor
20a second proximity signal
22 (first) electrode pair
24 (second) electrode pair
26 control unit
28 insertion direction
30 signal path
32 connecting piece
34 signal line
36 control channel
40 method
48 pulse of the first proximity signal
50 pulse of the second proximity signal
52 pulse of the first proximity signal
54 (average) output value of the first proximity signal
56 raised value of the first proximity signal
58 inactive operating mode
60 active operating mode
61 proximity-sensor electronics
62 recess
63 seal
64 gap
65 printed circuit board
66 IC, μC
67 leads
A outside
I inside
C1 first capacitance
C2 second capacitance
t time axis
t1 time
t2 time
Δt time interval
1/Δt pulse repetition frequency

The invention claimed is:

1. A hearing device or hearing aid device, comprising:
an earpiece having a first proximity sensor, a second proximity sensor and a control unit;
said first proximity sensor being configured to transmit a first proximity signal to said control unit;
said second proximity sensor being configured to transmit a second proximity signal to said control unit;
said earpiece being at least partly insertable in an insertion direction into an external auditory canal of a user of the hearing device for operation of the hearing device;
said first proximity sensor and said second proximity sensor being disposed one behind another in said earpiece relative to said insertion direction; and
said control unit being configured to at least one of:
upon insertion of the earpiece into the external auditory canal, shift the hearing device into an active operating mode in an event of a change in said first proximity signal and a change in said second proximity signal following said change in said first proximity signal after a predetermined time interval, or
upon removal of the earpiece from the external auditory canal, shift the hearing device into an inactive operating mode in an event of a change in said second proximity signal and a change in said first proximity signal following said change in said second proximity signal after a predetermined time interval.

2. The hearing device according to claim 1, wherein said control unit is configured to control said operating mode of the hearing device according to a time sequence of changes in said first proximity signal and in said second proximity signal.

3. The hearing device according to claim 1, wherein said first proximity signal is transmitted to said control unit by said first proximity sensor in pulsed operation at a defined first pulse repetition frequency, and/or said second proximity signal is transmitted to said control unit by said second proximity sensor in pulsed operation at a defined second pulse repetition frequency.

4. The hearing device according to claim 3, wherein at least one of said defined first pulse repetition frequency or said defined second pulse repetition frequency is reduced after a specified time period in at least one of an active operating mode or an inactive operating mode.

5. The hearing device according to claim 1, wherein at least one of said first proximity sensor or said second proximity sensor is a contactless proximity sensor.

6. The hearing device according to claim 5, wherein at least one of said first proximity sensor or said second proximity sensor is a capacitive sensor.

7. The hearing device according to claim 6, wherein at least one of said first proximity sensor or said second proximity sensor is formed by two electrodes in a planar electrode pair, said two electrodes having given dimensions and being disposed opposite one another at a distance being smaller than said given dimensions.

8. A method for controlling a hearing device or hearing aid device, the method comprising the following steps:
placing a first proximity sensor and a second proximity sensor in an earpiece one behind another relative to an insertion direction of the hearing device into an external auditory canal of a user of the hearing device;

using the first proximity sensor to generate a first proximity signal;
using the second proximity sensor to generate a second proximity signal;
inserting the earpiece at least partly into the external auditory canal of the user of the hearing device for operation of the hearing device; and
at least one of:
upon insertion of the earpiece into the external auditory canal, shifting the hearing device into an active operating mode in an event of a change in the first proximity signal and a change in the second proximity signal following at a predetermined time interval after the change in the first proximity signal, or
upon removal of the earpiece from the external auditory canal, shifting the hearing device into an inactive operating mode in an event of a change in the second proximity signal and a change in the first proximity signal following at a predetermined time interval after the change in the second proximity signal.

9. The method according to claim 8, which further comprises detecting at least one of:
a change in the first proximity signal and a change in the second proximity signal following at a predetermined time interval after the change in the first proximity signal, and shifting the hearing device into the active operating mode as a result, or
a change in the second proximity signal and a change in the first proximity signal following at a predetermined time interval after the change in the second proximity signal, and shifting the hearing device into the inactive operating mode as a result.

* * * * *